(12) United States Patent
Moon et al.

(10) Patent No.: US 9,368,720 B1
(45) Date of Patent: Jun. 14, 2016

(54) METHOD TO MAKE PHASE-CHANGE MATERIAL RF SWITCHES WITH THERMAL DIELECTRICS

(71) Applicant: HRL LABORATORIES LLC, Malibu, CA (US)

(72) Inventors: Jeong-Sun Moon, Moorpark, CA (US); Hwa-Chang Seo, Torrance, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/528,945

(22) Filed: Oct. 30, 2014

Related U.S. Application Data (60) Provisional application No. 61/989,389, filed on May 6, 2014.

(51) Int. Cl.
*H01L 45/00* (2006.01)

(52) U.S. Cl.
CPC ........ *H01L 45/1286* (2013.01); *H01L 45/1293* (2013.01); *H01L 45/144* (2013.01); *H01L 45/1608* (2013.01)

(58) Field of Classification Search
CPC ... H01L 45/06; H01L 45/1226; H01L 45/128; H01L 45/144
See application file for complete search history.

(56) References Cited

U.S. PATENT DOCUMENTS 7,728,319 B2 * 6/2010 Goux .................. H01L 27/2445
257/3

OTHER PUBLICATIONS

A. Botula et al., "A Thin-film SOI 180 nm CMOS RF Switch Technology", Silicon Monolithic Integrated Circuits in RF Systems (SIRF), pp. 1-4, Jan. 2009.
D. Kelly, C. Brindle, C. Kemerling, and M. Stuber, "The State-of-the-art of Silicon-on-Sapphire CMOS RF switches", CSICS Digest, pp. 200-203, 2005.
S. Makioka et al., "Super self-aligned GaAs RF switch IC with 0.25 dB extremely low insertion loss for mobile communications", IEEE Trans. Electron Devices, vol. 48, No. 8, pp. 1510-1514, Aug. 2001.
A. Tomback et al., "Cellular Antenna Switches for Multimode Applications based on a Silicon-on-Insulator Technology", Radio Frequency Integrated Circuits Symposium (RFIC), pp. 271-274, May 2010.
G. Rebeiz et al., "Tuning in to RF MEMS" IEEE Microwave Magazine, pp. 55-72, Oct. 2009.
EE Times, Nov. 2011, "Samsung preps 8-Gbit phase-change memory", pp. 1-6.
Perniola et al, "Electrical behavior of phase change memory cells based on GeTe", IEEE EDL., vol. 31, No. 5, pp. 488-490,May 2010.
Chua et al., "Low resistance, high dynamic range reconfigurable phase change switch for RF applications", Applied Physics Letters vol. 97, 183506-183506-3, 2010.

(Continued)

*Primary Examiner* — Mark Prenty
(74) *Attorney, Agent, or Firm* — Ladas & Parry (57) ABSTRACT

A switch includes an input port, an output port, a phase change material coupled between the input port and the output port, a heater, and a thermal dielectric layer in between the heater and the phase change material, and in contact with the heater and the phase change material. The thermal dielectric layer provides thermal conduction between the phase change material and the heater, and the thermal dielectric layer is nonmetallic and electrically non-conductive and includes polycrystalline AlN, diamond, or SiC.

20 Claims, 10 Drawing Sheets

(56) References Cited

OTHER PUBLICATIONS

Lo et al., "Three- terminal probe reconfigurable phase-change material switches", IEEE Transactions on Electron Devices., vol. 57, No. 1, pp. 312-320, Jan. 2010.

Wen et al., "A phase-change via-reconfigurable on-chip inductor", IEDM Tech digest, pp. 10.3.1-10.3.4 Dec. 2010.

J. S. Moon et al., "High-linearity 1 ohm RF switches with phase-change materials", SIRF, pp. 7-9, Jan. 2014.

El-Hinnawy et al., "Four-terminal inline Chalcogenide phase-change RF switch using an independent resistive heater for thermal actuation", IEEE EDL, vol. 34, No. 10, pp. 1313-1315, Oct. 2013.

Y-H Shim and M. Rais-Zadel, "Non-linear analysis of RF ohmic switches based on phase-change materials", IEEE EDL, vol. 35, No. 3, pp. 405-407, Mar. 2014.

* cited by examiner

FIG. 1A

PRIOR ART

METHOD TO MAKE PHASE-CHANGE MATERIAL RF SWITCHES WITH THERMAL DIELECTRICS

CROSS REFERENCE TO RELATED APPLICATIONS

This application is related to and claims the benefit of U.S. Provisional Patent Application Ser. No. 61/989,389, filed May 6, 2014, which is incorporated herein as though set forth in full.

STATEMENT REGARDING FEDERAL FUNDING

This invention was made under U.S. Government contract N00014-13-C-0022. The U.S. Government has certain rights in this invention.

TECHNICAL FIELD

This disclosure relates to RF switches using phase-change materials (PCMs).

BACKGROUND

Radio frequency (RF) switches are key elements of RF systems including communications and radar, where RF switches enable low-loss, low-noise, fast, linear signal routing, impedance tuning, and phase shifting. Linearity is very important over mW to ~1 Watt system RF power levels.

References 1-13 are listed below and are incorporated herein by reference as though set forth in full. Various RF switches are available, including silicon on Indium (SOI), as described in Reference 1 below, silicon on sapphire (SOS), as described in Reference 2 below, pHEMT FET switches, as described in References 3 and 4 below, and RF MEMS switches, as described in Reference 5 below. Key desired features of RF switches include low insertion loss, high isolation, excellent linearity, power handling, easy integration with conventional semiconductor technologies, high reliability and reasonable size for packaging. The prior art RF switches typically have the following figure of merit (FOM) for $R_{on} \cdot C_{off}$: 250 femtosecond for SOI switches; 448 for SOS switches; 280 for pHEMT switches; and approximately 4 for RF micro-electromechanical system (MEMS) switches.

RF MEMS switches offer the best FOM and have an excellent linearity of greater than 70 dBm. However, while RF MEMS switches have been demonstrated in RF systems with the desired low-loss, low-noise, isolation, linearity, and adequate power handling, issues remain for reaching the desired switching voltage (30-70 V), reliability and packaging. Thus, even after decades of research, RF-MEMS are not ubiquitously found in RF systems. MMIC integration is generally limited because of size and voltage requirements, and applicability to mobile platforms is very difficult because of switching voltage requirements.

RF switches with phase change material (PCM) offer a non-volatile switch option, which eliminates the need for standby power to maintain a SET or RESET status; however, during switching, RF switches with PCM require current pulses of 50-1000 nanoseconds depending on the switch cell size.

The principles of operation of PCM has been known since the 1960s and PCM has been used in rewritable optical DVDs using $Ge_2Sb_2Te_5$ or $(Ag,In)Sb_2Te$. Lately, PCMs have been developed for non-volatile memory as a future replacement for flash memory in the IC industry by companies such as Micron, Samsung, IBM, STMicroelectronics, and Intel. Two of the latest reports on digital PCMs include References 6 and 7 below.

References 8-13 below describe using PCM in RF applications as RF switches. While Reference 8 mentions using PCM material for RF switches, no RF switch designs are shown. The switch of Reference 9 has a three-terminal layout, consisting of an array of sub-vias, and the switching is performed using external probes. Reference 10 shows via structures with GeTe material, where Ron is 1.1 ohm with Ron/Roff of $3\times10^4$, and the switching is performed using external probes. Reference 11 describes an RF switches with PCM.

Figure 1A:
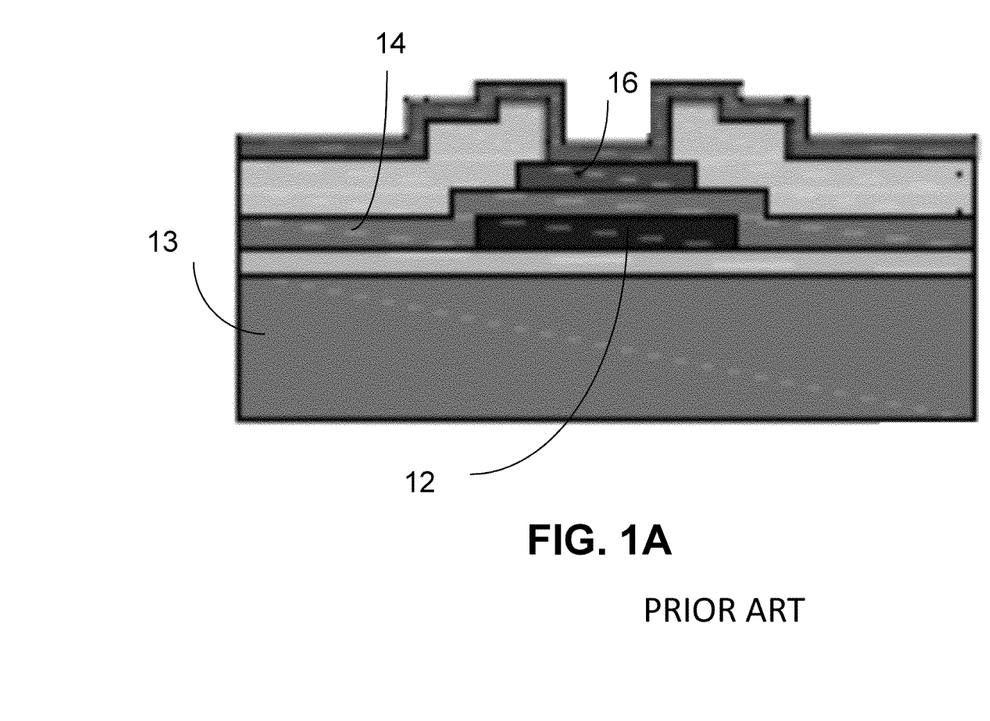
FIG. 1A shows a RF-PCM switch layout with a microheater and with a SiNx passivation and dielectric layer between the heater and phase-change material in accordance with the prior art.
Figure 1B:
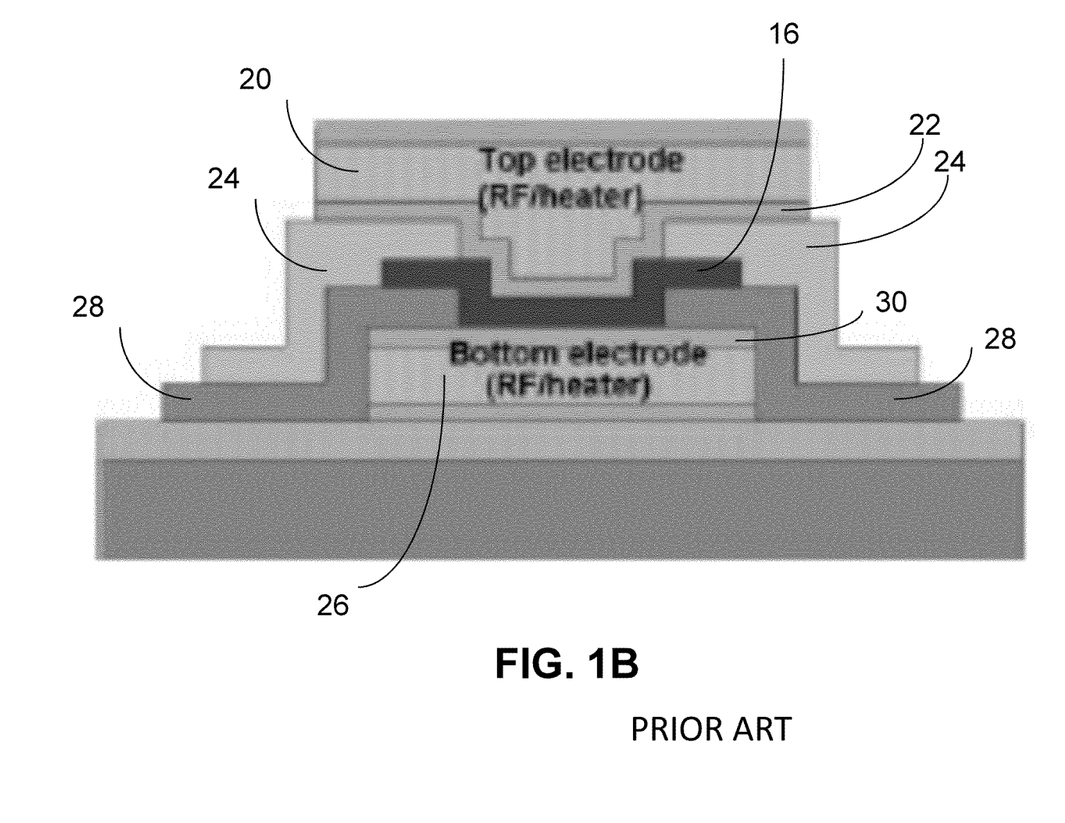
FIG. 1B shows a RF-PCM switch layout with both top and bottom heaters with PCM separated by passivation and dielectric layers from the heaters in accordance with the prior art.

Reference 12 describes an electric heater 12 integrated on a Si or SiC substrate 13, with the heater 12 and the PCM 16 separated by a SiNx dielectric layer 14, as shown in FIG. 1A. Reference 13 describes a RF-PCM switch layout that has a top heater 20 with a $SiO_2$ passivation layer 22 and a Cr diffusion layer 24 between the top heater 20 and phase change material 16, and a bottom heater 26 with a $SiO_2$ passivation layer 22 and a Cr diffusion layer 30 between the bottom heater 26 and the phase change material 16, as shown in FIG. 1B. Using a SiNx or $SiO_2$ dielectric layer separates the heater from the PCM, but there is significant parasitic capacitive coupling of RF to the heater, which increases the off-state capacitance and reduces the RF isolation.

REFERENCES

The following References are incorporated herein by reference as though set forth in full.

[1] A. Boutla et al., "A Thin-film SOI 180 nm CMOS RF Switch Technology", Silicon Monolithic Integrated Circuits in RF Systems (SiRF), pp. 1-4, 2009.

[2] D. Kelly, C. Brindle, C. Kemerling, and M. Stuber, "The State-of-the-art of Silicon-on-Sapphire CMOS RF switches", CSICS Digest, pp. 200-203, 2005.

[3] S. Makioka et al., "Super self-aligned GaAs RF switch IC with 0.25 dB extremely low insertion loss for mobile communications", IEEE Trans. Electron Devices, vol. 48, pp. 1510-1514, 2001.

[4] A. Tomback et al., "Cellular Antenna Switches for Multimode Applications based on a Silicon-on-Insulator Technology", Radio Frequency Integrated Circuits Symposium (RFIC), p. 271, 2010.

[5] G. Rebeiz et al., "Tuning in to RF MEMS" IEEE Microwave Magazine, pp. 55-72, 2009.

[6] E E Times, November, 2011, "Samsung preps 8-Gbit phase-change memory"

[7] Perniola et al", "Electrical behavior of phase change memory cells based on GeTe", IEEE EDL., vol. 31, p. 488, (2010).

[8] Chua et al., "Low resistance, high dynamic range reconfigurable phase change switch for RF applications", Applied Physics Letters vol. 97, 183506, (2010).

[9] Lo et al., "Three-terminal probe reconfigurable phase-change material switches", IEEE Transactions on Electron Devices., vol. 57, p. 312, (2010).

[10] Wen et al., "A phase-change via-reconfigurable on-chip inductor", IEDM Tech digest, (2010).

[11] J. S. Moon et al., "High-linearity 1 ohm RF switches with phase-change materials", SiRF, January 2014.

[12] El-Hinnawy et al., "Four-terminal inline Chalcogenide phase-change RF switch using an independent resistive heater for thermal actuation", IEEE EDL, vol. 34, p. 1313, (2013).

[13] Y-H Shim and M. Rais-Zadel, "Non-linear analysis of RF ohmic switches based on phase-change materials", IEEE EDL, vol. 35, p. 405, (2014).

What is needed is an improved RF switch using PCM that has a higher speed performance and reduced parasitic capacitive coupling. The embodiments of the present disclosure address these and other needs.

SUMMARY

In a first embodiment disclosed herein, a switch comprises an input port, an output port, a phase change material coupled between the input port and the output port, a heater, and a thermal dielectric layer in between the heater and the phase change material, and in contact with the heater and the phase change material, wherein the thermal dielectric layer provides thermal conduction between the phase change material and the heater, and wherein the thermal dielectric layer is nonmetallic and electrically non-conductive and comprises polycrystalline AlN, diamond, or SiC.

In another embodiment disclosed herein, a method of of fabricating a switch comprises providing a heater coupled to a substrate, forming a thermal dielectric layer on the heater, forming phase change material on the thermal dielectric layer, forming an input port in contact with the phase change material, and forming an output port in contact with the phase change material, wherein the output port is not in contact with the input port, wherein the thermal dielectric layer provides thermal conduction between the phase change material and the heater, and wherein the thermal dielectric layer is nonmetallic and electrically non-conductive and comprises polycrystalline AlN, diamond, or SiC.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The present disclosure discloses RF switches using phase-change material (PCM), where a thermal dielectric layer or via made of materials such as polycrystalline AlN, diamond, or SiC is situated between the phase-change material and a microheater. The integration process for the PCM RF switches of the present disclosure is compatible with conventional semiconductor RFIC and MMIC processes. The phase-change material may be a binary compound of $Ge_xTe_{1-x}$.

Figure 2:
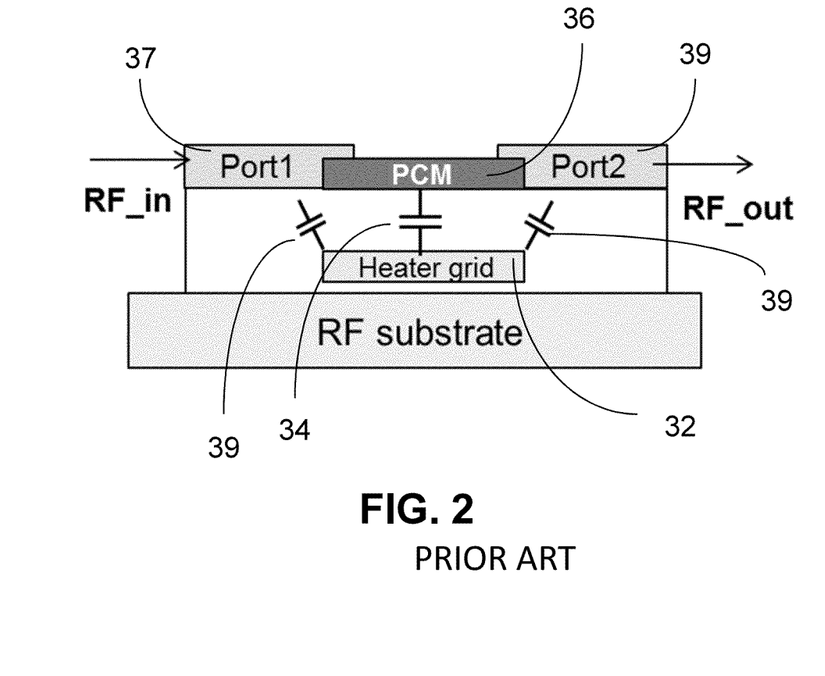
FIG. 2 shows a schematic of a PCM RF switch with an heater, showing parasitic capacitive coupling in accordance with the prior art.

FIG. 2 shows a schematic of an example PCM RF switch with a heater 32 and parasitic capacitive coupling 34 between PCM 36 and the heater 32. The PCM 36 is between the RF input port 37 and the RF output port 38, and parasitic capacitive coupling 39 may also be between the RF input port 37 and the RF output port 38 and the heater 32. The parasitic capacitance increases the off-state capacitance and reduces the RF isolation.

Locating the heater 32 further away from the PCM layer can reduce parasitic coupling, but the required heater power increases. The PCM RF switches disclosed in this invention disclosure have a thermal dielectric or thermal dielectric via between the heater and the PCM to mitigate parasitic coupling, while maintaining heater power to the PCM.

Figure 3A:
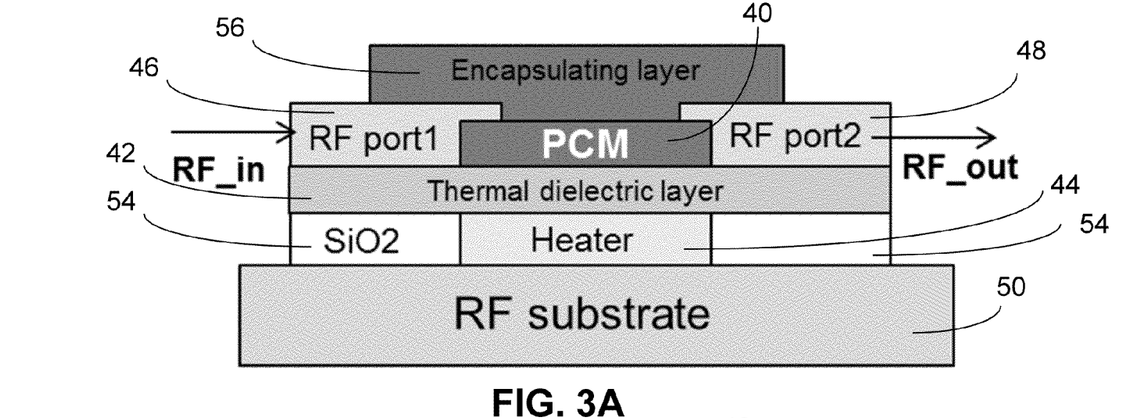
FIG. 3A shows a schematic of a PCM RF switch with a thermal dielectric layer between phase change material and a heater on an RF substrate.
Figure 3B:
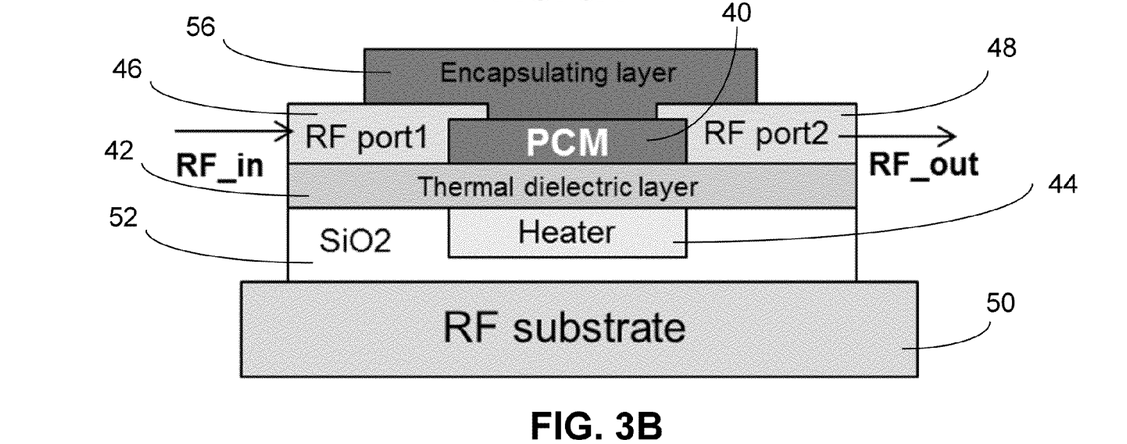
FIG. 3B shows a schematic of a PCM RF switch with a thermal dielectric layer between a phase-change material and a heater on top of an $SiO_2$ layer on an RF substrate in accordance with the present disclosure.

FIGS. 3A and 3B show schematics of RF switches with phase-change material 40 and a thermal dielectric layer 42 between the PCM 40 and a heater 44. The PCM 40 may be a material such as $Ge_xTe_{1-x}$ and be located between a RF input port 46 and the RF output port 48. The thermal dielectric layer 42 separates the heater 44 and the PCM 40 and increases the distance from the heater 44 to the RF input port 46, the RF output port 48, and the PCM 40, which reduces the parasitic capacitance coupling. A thermal path is provided from the heater 44 to the PCM 40 by the thermal dielectric layer 42. The thermal dielectric layer 42 is nonmetallic and electrically non-conductive and may be AlN, diamond, or SiC, and provides thermal conduction between the phase change material and the heater.

The embedded heater 44 may be directly fabricated on top of an RF substrate 50, as shown in FIG. 3A, or located on top of a non-thermal dielectric layer such as $SiO_2$ layer 52 on an RF substrate 50, as shown in FIG. 3B. An SiO2 layer 54 may also be between a portion of the thermal dielectric layer 42 and the RF substrate 50, as shown in FIG. 3A. The RF substrate 50 may be or include one or more of high-resistance Si, sapphire, borofloat, quartz, fused silica SiGe, Si, and III-V compounds such as GaN, InAs, InSb, and InP. An encapsulating layer 56 may cover the PCM 40 between the RF input port 46 and the RF output port 48. The encapsulating layer 56 may be $SiO_2$ or AlN.

Figure 4A:
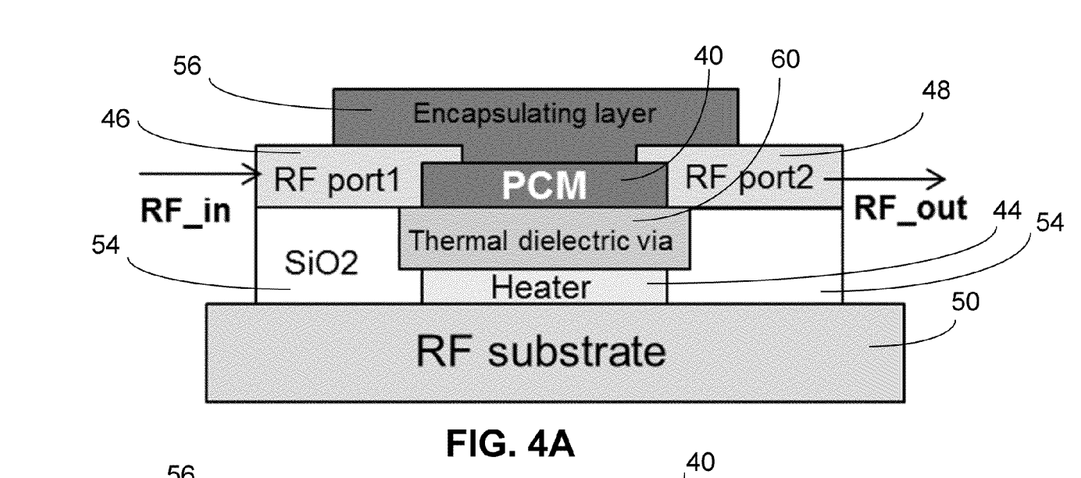
FIG. 4A shows a schematic of a PCM RF switch with a a thermal dielectric via between phase change material and a heater on an RF substrate.
Figure 4B:
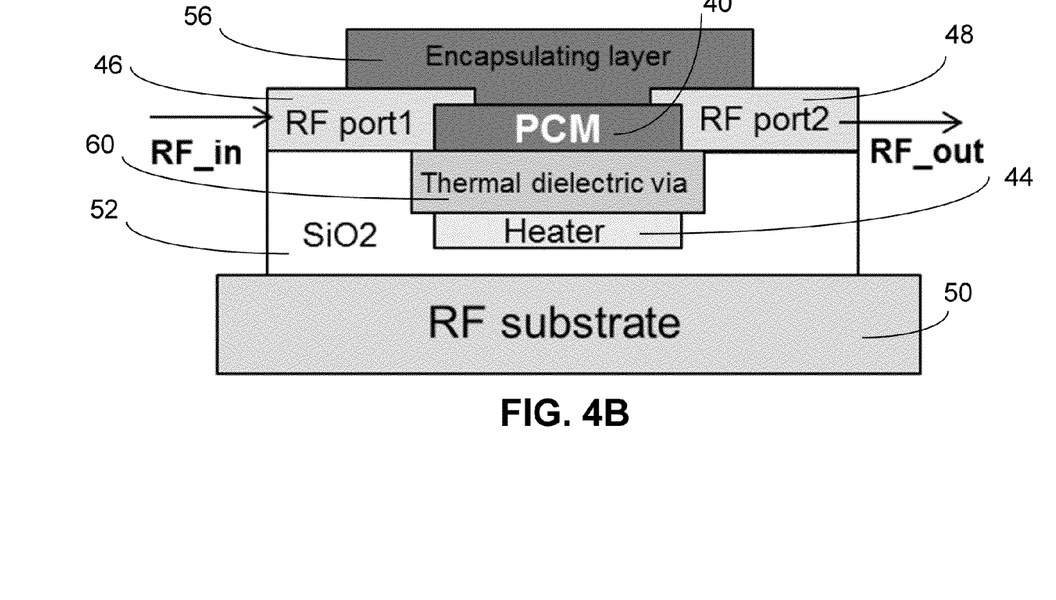
FIG. 4B shows a schematic of a PCM RF switch with a thermal dielectric via between phase change material and a heater on top of an $SiO_2$ layer on an RF substrate.
Figure 4C:
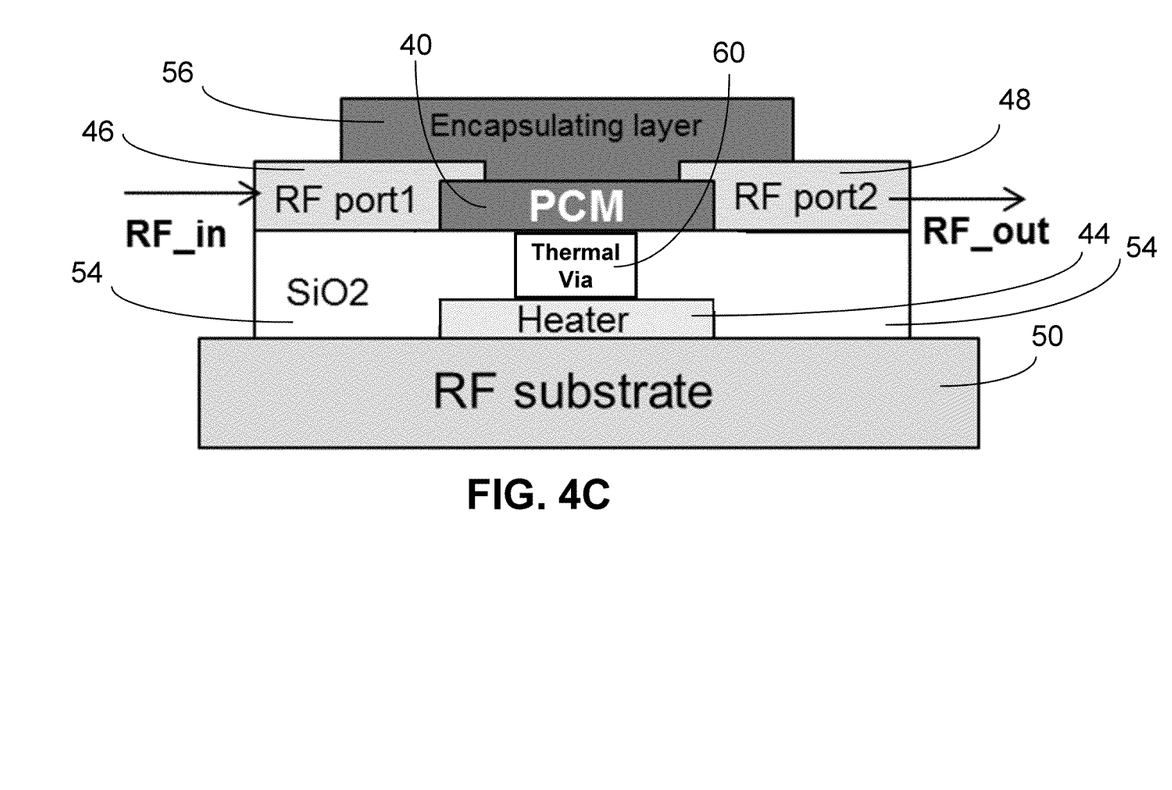
FIG. 4C shows another schematic of a PCM RF switch with a thermal dielectric via between phase change material and a heater on an RF substrate in accordance with the present disclosure.

The thermal dielectric layer may instead be a thermal via 60, which may also be called a thermal plug 60, as shown in FIGS. 4A, 4B and 4C, between the PCM 40 and the heater 44. FIGS. 4A and 4B show that the thermal via or plug 60 may have an extent or length that is about the same as the extent or length of the PCM 40, or may only have an extent, length or other dimension that is less than the extent or length of the PCM 40, as shown in FIG. 4C. Again, the PCM 40 may be $Ge_xTe_{1-x}$ and is embedded between the RF input port 46 and the RF output port 48.

The thermal dielectric via 60 separates the heater 44 and the PCM 40 and increases the physical distance from the heater 44 to the RF input port 46, the RF output port 48, and the PCM 40, which reduces the parasitic capacitance coupling. A thermal path is provided from the heater 44 to the PCM 40 by the thermal dielectric via 60. The thermal dielectric via 60 is nonmetallic and electrically non-conductive and may be AlN, diamond, or SiC, and provides thermal conduction between the phase change material and the heater.

The embedded heater 44 may be directly fabricated on top of an RF substrate 50, as shown in FIG. 4A, or located on top of a non-thermal dielectric layer such as $SiO_2$ layer 52 on an RF substrate 50, as shown in FIG. 4B. An SiO2 layer 54 may also be between a portion of the thermal dielectric via 60 and the RF substrate 50, as shown in FIG. 4A. The RF substrate 50 may be or include one or more of high-resistance Si, sapphire, borofloat, quartz, fused silica SiGe, Si, and III-V compounds such as GaN, InAs, InSb, and InP. An encapsulating layer 56 may cover the PCM 40 between the RF input port 46 and the RF output port 48. The encapsulating layer 56 may be $SiO_2$ or AlN.

Figure 5A:
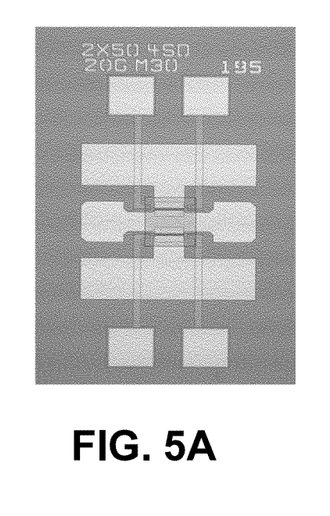
FIG. 5A shows an optical image of a fabricated RF switch with a AlN thermal dielectric layer between a NiCr heater and GeTe phase change material.
Figure 5B:
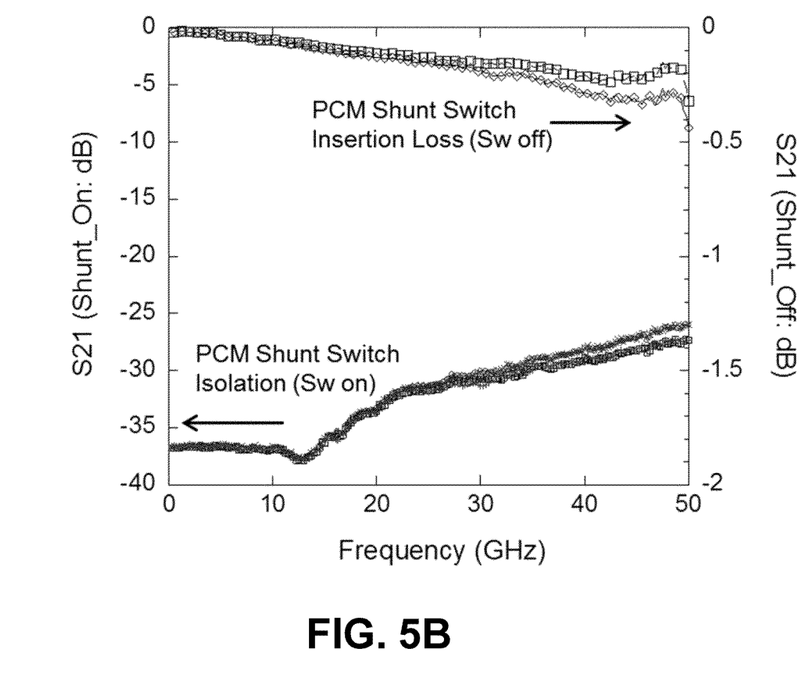
FIG. 5B shows a graph of measured PCM RF switch with reduced parasitic coupling having a 10 THz switch speed in accordance with the present disclosure.

FIG. 5A shows an optical image of a fabricated RF switch with a AlN thermal dielectric layer between a NiCr heater and GeTe phase change material. The graphs shown in FIG. 5B show RF performance of the RF switch up to 50 GHz. The RF switch has an insertion loss less than 0.5 dB and an isolation of greater than 25 dB over the frequency range from 0 to 50 GHz. These characteristics provide an RF switch that has a switching speed up to 10 THz.

Figure 6:
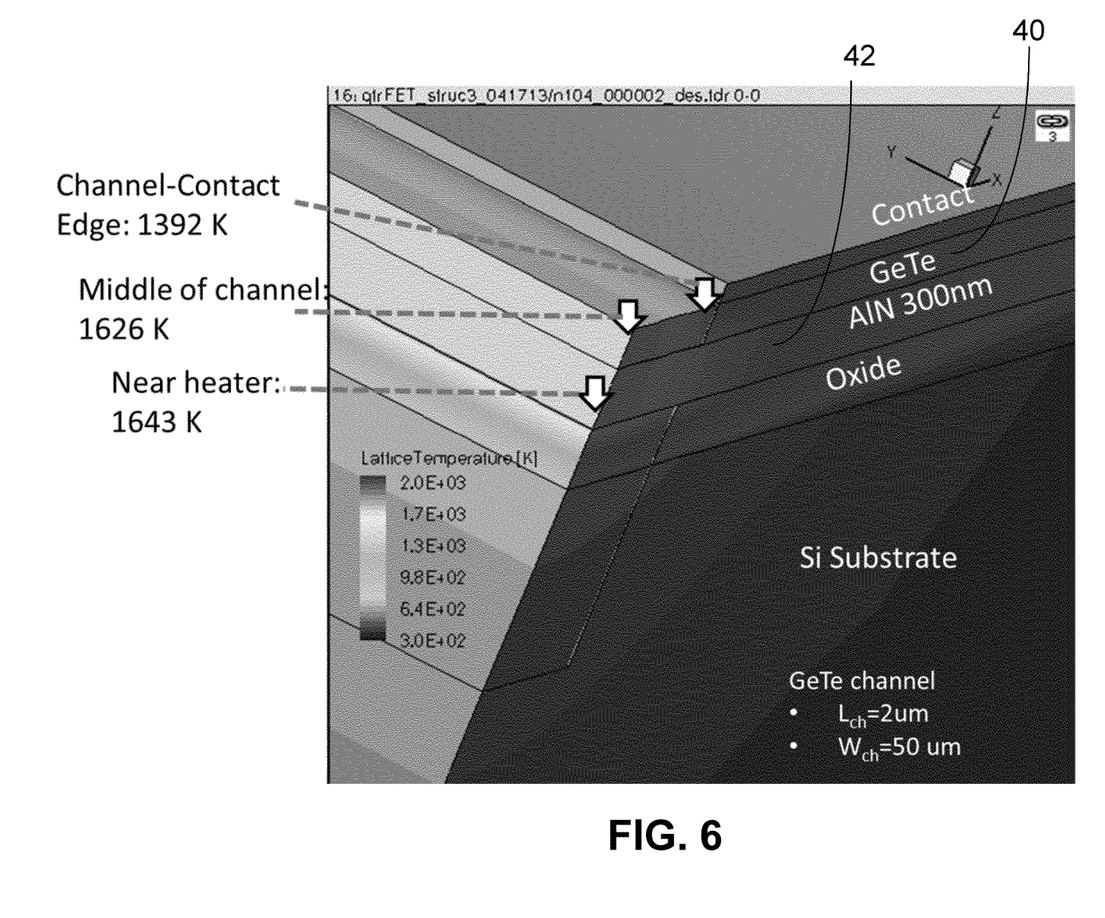
FIG. 6 shows thermal modeling of the PCM RF switch of FIG. 3B with a 2 W, 200 nsec pulse to the heater in accordance with the present disclosure.

FIG. 6 shows the results of thermal modeling for the PCM RF switch of FIG. 3B with a 2 W, 200 nsec pulse applied to the heater. The thermal dielectric layer 42 is between the heater and the PCM 40. The peak temperature reaches up to ~1090° C., which is well above the GeTe melting point of 742° C., which indicates that the thermal dielectric layer 42 provides an excellent thermal path.

Figure 7A:
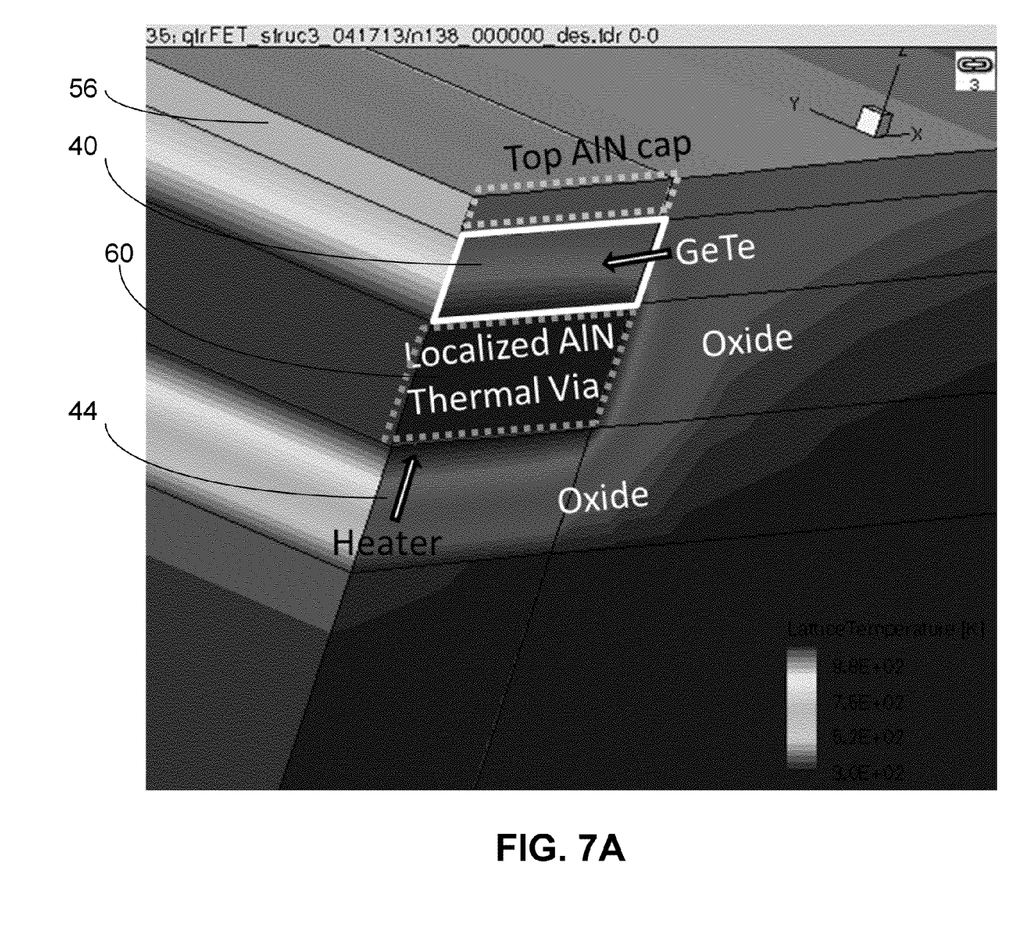
FIG. 7A shows thermal modeling of PCM RF switches with the localized AlN thermal dielectric via and capping layer with a uniform heating.

FIG. 7A shows thermal modeling of a PCM RF switch with a localized AlN thermal dielectric via 60 between PCM 40 and heater 44, and with an AlN encapsulating layer 56, according to FIG. 4A or 4C. The thermal dielectric via 60 provides an excellent thermal path from the PCM 40 to the heater 44.

Figure 7B:
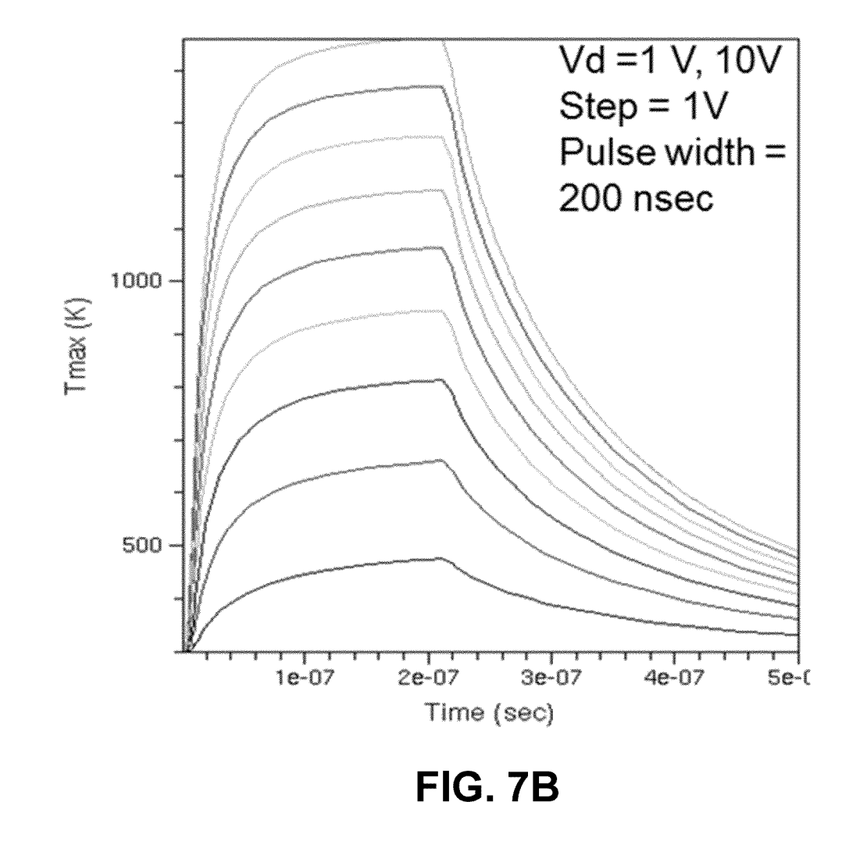
FIG. 7B shows that both a SET transition and a RESET transition are well-defined with the localized AlN thermal dielectric via and capping layer in accordance with the present disclosure.

FIG. 7B shows a temperature profile to induce a PCM switch SET and RESET transition. With the localized AlN thermal dielectric via 60, the transient behavior is well defined for both the SET and RESET processes.

The disclosed RF-PCM switches can be integrated with conventional semiconductor RFIC and MMIC processes, potentially enabling reconfigurable RFICs and MMICs. The semiconductor materials and substrates may include Si, SiGe, and III-V compounds such as GaN, InAs, InSb, and InP. The semiconductor device technologies include FETs and bipolar transistors. The RF-PCM switches may also be integrated with resistors, inductors and capacitors to make the passive elements reconfigurable.

In summary, the disclosed RF switches based on PCM materials such as $Ge_xTe_{1-x}$ consist of one or more thermal dielectric layers or a localized thermal dielectric via or plug for a thermal path to a heater. The PCM RF switch layouts enable high-speed performance, and a 10 THz switching speed with a reduced capacitive parasitic coupling. The disclosed PCM RF switches enable reconfigurable RF functions in RFICs, MMICs, and passive devices such as single-pole-double-throw (SPDT) switches, phase shifters, and filters. Also, the PCM RF switches can be integrated with antennas.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A switch comprising:
an input port;
an output port;
a phase change material coupled between the input port and the output port;
a heater; and
a thermal dielectric layer in between the heater and the phase change material, and in contact with the heater and the phase change material;
wherein the thermal dielectric layer provides thermal conduction between the phase change material and the heater; and wherein the thermal dielectric layer is nonmetallic and electrically non-conductive and comprises polycrystalline AlN, or diamond.

2. The switch of claim 1 wherein the phase change material comprises a binary compound of $Ge_xTe_{1-x}$.

3. The switch of claim 1 further comprising:
a substrate; and
wherein the heater is in direct contact with the substrate.

4. The switch of claim 3 wherein the substrate comprises Si, high resistance Si, sapphire, borofloat, quartz, fused silica, SiGe, or III-V compounds including GaN, InAs, InSb, and InP.

5. The switch of claim 1 further comprising:
a substrate; and
a $SiO_2$ dielectric layer on the substrate;
wherein the heater is in direct contact with the $SiO_2$ dielectric layer.

6. The switch of claim 1 further comprising:
an encapsulating layer over the phase change material on a side of the phase change material opposite the thermal dielectric layer.

7. The switch of claim 6 wherein the encapsulating layer comprises $SiO_2$ or AlN.

8. The switch of claim 1:
wherein the thermal dielectric layer is a thermal via; and
wherein the thermal via has an extent that is less than an extent of the phase change material.

9. The switch of claim 1 wherein:
the switch has an insertion loss less than 0.5 dB and an isolation of greater than 25 dB over a frequency range from 0 to 50 GHz.

10. The switch of claim 1 wherein:
the switch has a switching speed up to 10 THz.

11. A method of fabricating a switch, the method comprising:
providing a heater coupled to a substrate;
forming a thermal dielectric layer on the heater;
forming phase change material on the thermal dielectric layer;
forming an input port in contact with the phase change material; and
forming an output port in contact with the phase change material, wherein the output port is not in contact with the input port;
wherein the thermal dielectric layer provides thermal conduction between the phase change material and the heater; and
wherein the thermal dielectric layer is nonmetallic and electrically non-conductive and comprises polycrystalline AlN, or diamond.

12. The method of claim 11 wherein the phase change material comprises a binary compound of $Ge_xTe_{1-x}$.

13. The method of claim 11 wherein the substrate comprises Si, high resistance Si, sapphire, borofloat, quartz, fused silica, SiGe, or III-V compounds including GaN, InAs, InSb, and InP.

14. The method of claim 11 further comprising:
forming a $SiO_2$ dielectric layer on the substrate;
wherein the $SiO_2$ dielectric layer is between the heater and the substrate.

15. The method of claim 11 further comprising:
forming an encapsulating layer over the phase change material on a side of the phase change material opposite the thermal dielectric layer.

16. The method of claim 15 wherein the encapsulating layer comprises $SiO_2$ or AlN.

17. The method of claim 11:
wherein the thermal dielectric layer is a thermal via; and
wherein the thermal via has an extent that is less than an extent of the phase change material.

18. The method of claim 11:
wherein the switch has an insertion loss less than 0.5 dB and an isolation of greater than 25 dB over a frequency range from 0 to 50 GHz.

19. The method of claim 11:
wherein the switch has a switching speed up to 10 THz.

20. The method of claim 11:
wherein the heater is in direct contact with the substrate.

* * * * *